(12) United States Patent
Hwang et al.

(10) Patent No.: US 12,101,912 B2
(45) Date of Patent: Sep. 24, 2024

(54) METHOD FOR MANUFACTURING HEAT DISSIPATION SHEET

(71) Applicant: AMOGREENTECH CO., LTD., Gimpo-si (KR)

(72) Inventors: Seung Jae Hwang, Incheon (KR); Jin Hyoung Lee, Gimpo-si (KR)

(73) Assignee: AMOGREENTECH CO., LTD., Gimpso-si (KR)

( * ) Notice: Subject to any disclaimer, the term of this patent is extended or adjusted under 35 U.S.C. 154(b) by 661 days.

(21) Appl. No.: 17/419,888

(22) PCT Filed: Jan. 3, 2020

(86) PCT No.: PCT/KR2020/000108
§ 371 (c)(1),
(2) Date: Jun. 30, 2021

(87) PCT Pub. No.: WO2020/141925
PCT Pub. Date: Jul. 9, 2020

(65) Prior Publication Data
US 2022/0095486 A1  Mar. 24, 2022

(30) Foreign Application Priority Data

Jan. 3, 2019 (KR) .................. 10-2019-0000820
Jan. 4, 2019 (KR) .................. 10-2019-0001139

(51) Int. Cl.
*H05K 7/20* (2006.01)
*C08K 3/013* (2018.01)
(Continued)

(52) U.S. Cl.
CPC ......... *H05K 7/20481* (2013.01); *C08K 3/013* (2018.01); *C08K 3/042* (2017.05); *C08K 5/14* (2013.01); *C08L 9/06* (2013.01)

(58) Field of Classification Search
None
See application file for complete search history.

(56) References Cited

U.S. PATENT DOCUMENTS 6,812,312 B1 * 11/2004 Ito .......................... C08K 5/14
526/335
10,125,237 B2 11/2018 Tashiro et al.
(Continued)

FOREIGN PATENT DOCUMENTS

CN   101954766 A   1/2011
EP   2270080 B1   5/2017
(Continued)

OTHER PUBLICATIONS

Machine translation of JP 2000-233907, retrieved from EPO database Mar. 22, 2024 (Year: 2024).*
(Continued)

*Primary Examiner* — Timothy Kennedy
(74) *Attorney, Agent, or Firm* — ROTHWELL, FIGG, ERNST & MANBECK, P.C.

(57) ABSTRACT

A method of manufacturing a heat dissipation sheet including preparing a preliminary sheet including a matrix-forming component, a crosslinking agent, and a heat dissipation filler, and crosslinking the matrix-forming component included in the preliminary sheet and thus obtaining a heat dissipation sheet. The heat dissipation sheet manufactured has remarkably excellent heat dissipation properties because it contains a high content of heat dissipation filler. Due to the material properties of the matrix-forming component and the crosslinking of the matrix-forming component and the resulting matrix formation, the occurrence of cracking, shrinkage, pore formation, thickness change, and the like is minimized or prevented, and excellent flexibility can be attained. Moreover, since processability is improved through processes such as cooling when manufacturing the heat (Continued)

dissipation sheet, productivity is excellent, and the sheet can be suitable for mass production.

13 Claims, 3 Drawing Sheets

(51) Int. Cl.
*C08K 3/04* (2006.01)
*C08K 5/14* (2006.01)
*C08L 9/06* (2006.01)

(56) References Cited

U.S. PATENT DOCUMENTS

| | | | |
|---|---|---|---|
| 10,457,845 | B2 | 10/2019 | Naito et al. |
| 10,851,277 | B2 | 12/2020 | Takagi et al. |
| 2004/0067372 | A1 | 4/2004 | Takei et al. |
| 2011/0308782 | A1* | 12/2011 | Merrill ............... C09K 5/08 165/185 |
| 2017/0338166 | A1 | 11/2017 | Nawa et al. |

FOREIGN PATENT DOCUMENTS

| | | | |
|---|---|---|---|
| JP | 06248164 | A * | 9/1994 |
| JP | 2000233907 | A | 8/2000 |
| JP | 2009013340 | A | 1/2009 |
| JP | 2012054312 | A | 3/2012 |
| JP | 2015098504 | A | 5/2015 |
| JP | 2015201602 | A | 11/2015 |
| JP | 2016088838 | A | 5/2016 |
| JP | 2017008321 | A | 1/2017 |
| JP | 2017208505 | A | 11/2017 |
| KR | 101550083 | B1 | 9/2015 |
| KR | 20170042365 | A | 4/2017 |
| KR | 20170122435 | A | 11/2017 |
| KR | 101817746 | B1 | 1/2018 |

OTHER PUBLICATIONS

Machine translation of JP 06248164, retrieved from EPO database Mar. 22, 2024 (Year: 2024).*
International Search Report issued in PCT/KR2020/000108 dated Apr. 23, 2021, 2 pages.
Office Action issued in Chinese application No. 202080007545.9 dated Aug. 25, 2023, 14 pgs.

* cited by examiner

METHOD FOR MANUFACTURING HEAT DISSIPATION SHEET

CROSS REFERENCE TO RELATED APPLICATION

This application is a 35 U.S.C. 371 National Phase Entry Application from PCT/KR2020/000108, filed Jan. 3, 2020, which claims the benefit of Korean Patent Application Nos. 10-2019-0000820 filed on Jan. 3, 2019 and 10-2019-0001139 filed on Jan. 4, 2019, the disclosures of which are incorporated herein in their entireties by reference.

TECHNICAL FIELD

The present invention relates to a method of manufacturing a heat dissipation sheet, and more particularly, to a method of manufacturing a heat dissipation sheet having flexibility and excellent heat dissipation properties, which has significantly improved productivity due to improvement in processability.

BACKGROUND ART

In appliances and devices that are not intended to generate heat but have a component generating heat during operation, the generated heat not only degrades a function of the relevant component but also causes various problems in surrounding components, such as functional degradation, malfunction, and loss of functionality due to degradation. Accordingly, research on heat dissipation structures to solve the heat generation problem has been conducted for a long time in various industries. As a result of the research, various heat dissipation devices such as heat dissipation fans, heat dissipation fins, and heat pipes have been developed in the past, and recently, various heat dissipation materials such as heat dissipation pads, heat dissipation sheets, and heat dissipation paints have been developed to assist or replace existing heat dissipation mechanisms.

Among these, the heat dissipation sheets have superior heat dissipation properties compared to the heat dissipation paints and are thin, and thus can be easily applied to appliances or devices without causing any change in the structural design of the appliances or devices or while causing only a slight change in the structural design, and recently, active efforts are being made to develop heat dissipation sheets in various fields such as energy, construction, military, automobile, and medical fields.

However, since materials known to have high heat dissipation performance generally have low resistance and high permittivity, the performance of the other components in appliances or devices to which the heat dissipation materials are applied may be degraded, or functionality may be lost through these components. In addition, depending on the structure of a heat source, irregularities may be present in a surface to which a heat dissipation sheet is applied, but conventional heat dissipation sheets are not flexible enough to effectively adhere to the uneven application surface. Moreover, the conventional heat dissipation sheets still do not satisfy the conditions required for heat dissipation sheets in terms of the heat dissipation material content of the sheets and the level of heat dissipation resulting therefrom.

DISCLOSURE

Technical Problem

The present invention is directed to providing a method of manufacturing a heat dissipation sheet having excellent heat dissipation performance despite being designed to have low permittivity.

In addition, the present invention is directed to providing a method of manufacturing a heat dissipation sheet which is designed to have excellent heat dissipation performance but is highly flexible and has little or no risk of cracking, shrinkage, and pore formation.

In addition, the present invention is directed to providing a method of manufacturing a heat dissipation sheet with significantly improved productivity due to improvement in processability.

Technical Solution

One aspect of the present invention provides a method of manufacturing a heat dissipation sheet, which includes (1) preparing a preliminary sheet including a matrix-forming component, a crosslinking agent, and a heat dissipation filler, and (2) crosslinking the matrix-forming component included in the preliminary sheet and thus obtaining a heat dissipation sheet.

In one embodiment of the present invention, the matrix-forming component in the preliminary sheet may be in an uncrosslinked state or in a partially crosslinked state.

In addition, step (2) may include crosslinking one or more of the preliminary sheets while applying heat and pressure, and cooling the crosslinked preliminary sheets while applying pressure.

In addition, the crosslinking may be carried out by stacking two to five of the preliminary sheets and applying pressure thereto.

In addition, the crosslinking and the cooling may be carried out using a first press and a second press having different temperatures.

In addition, the crosslinking may be carried out at a temperature of 100 to 180° C. for 10 to 60 minutes, and the cooling may be performed at a temperature of 20 to 60° C. for 10 to 60 minutes.

In addition, the heat dissipation filler may have an average particle diameter of 1 to 40 μm, and may be included at 85 wt % or more based on the total weight of the heat dissipation sheet.

In addition, the heat dissipation filler may include a first heat dissipation filler having a particle diameter of 1 to 5 μm, a second heat dissipation filler having a particle diameter of 10 to 20 μm, and a third heat dissipation filler having a particle diameter of 25 to 40 μm in a weight ratio of 1:1.5 to 3:3.5 to 5.

In addition, the heat dissipation filler may be surface-modified with one or more functional groups selected from the group consisting of a hydroxyl group, an alkyl group, an amine group, and an aniline group.

In addition, the matrix-forming component may include one or more rubber-based components selected from the group consisting of isoprene rubber (IR), butadiene rubber (BR), styrene-butadiene rubber (SBR), ethylene propylene diene monomer (EPDM) rubber, acrylic rubber, nitrile-butadiene rubber (NBR), and silicone rubber.

In addition, the crosslinking agent may include one or more selected from the group consisting of an isocyanate-based crosslinking agent and a peroxide-based crosslinking agent.

In addition, a thickness reduction rate calculated according to the following Mathematical Formula 1 may be 20% or more.

[Mathematical Formula 1]

Thickness reduction rate (%) =

$$\frac{\text{Preliminary sheet thickness } (\mu m) - \text{Heat dissipation sheet thickness } (\mu m)}{\text{Preliminary sheet thickness } (\mu m)} \times 100$$

In addition, the matrix-forming component may be a rubber-based component, and a thickness change rate calculated according to the following Mathematical Formula 2 after allowing the manufactured heat dissipation sheet to stand at 40° C. for 50 hours may be less than 10%.

[Mathematical Formula 2]

Thickness change rate (%) =

$$\frac{\text{Heat dissipation sheet thickness after standing } (\mu m) - \text{Heat dissipation sheet thickness before standing } (\mu m)}{\text{Heat dissipation sheet thickness before standing } (\mu m)} \times 100$$

In addition, the matrix-forming component may be SBR, and the crosslinking agent may be a peroxide-based crosslinking agent.

In addition, the heat dissipation sheet may have a density of 1.6 g/m³ or more.

Advantageous Effects

A heat dissipation sheet manufactured according to the present invention has remarkably excellent heat dissipation properties because it is designed to have high density. In addition, although the heat dissipation sheet is designed to have excellent heat dissipation performance, the occurrence of cracking, shrinkage, pore formation, thickness change, and the like is minimized or prevented, and excellent flexibility can be attained. Moreover, since processability is improved, productivity is excellent, and the sheet can be suitable for mass production.

BEST MODE

Hereinafter, embodiments of the present invention will be described in detail so as to be easily implemented by those of ordinary skill in the art to which the present invention pertains. The present invention may have various embodiments and is not limited to the embodiments described herein.

A method of manufacturing a heat dissipation sheet according to one embodiment of the present invention may include (1) preparing a preliminary sheet including a matrix-forming component, a crosslinking agent, and a heat dissipation filler, and (2) crosslinking the matrix-forming component included in the preliminary sheet and thus obtaining a heat dissipation sheet.

First, in step (1) of the present invention, a preliminary sheet including a matrix-forming component, a crosslinking agent, and a heat dissipation filler is prepared.

The preliminary sheet may be a sheet-forming composition including the matrix-forming component, the crosslinking agent, and the heat dissipation filler implemented in the form of a sheet through a conventional sheet-forming method.

In addition, the sheet-forming composition may additionally include a solvent suitable for dissolving the matrix-forming component and the like, and the preliminary sheet may be in a state in which the solvent included in the sheet-forming composition is dried. Alternatively, the preliminary sheet may be in a state in which some of the matrix-forming component is crosslinked by the crosslinking agent.

The matrix-forming component is a component configured to form a matrix by being crosslinked by the crosslinking agent to be described below, and is a component that maintains the sheet form. The matrix-forming component may be formed using a conventional organic compound used for manufacturing a sheet. For example, the matrix-forming component may be one or more selected from the group consisting of high-density polyethylene, polycarbonate, polyamide, polyimide, polyvinyl chloride, polypropylene, polystyrene, modified polypropylene ether (PPE), polyethylene imide (PEI), polyether ether ketone (PEEK), acrylonitrile-butadiene-styrene (ABS), an epoxy-based compound, an acrylic compound, polyurethane, isoprene rubber (IR), butadiene rubber (BR), styrene-butadiene rubber (SBR), ethylene propylene diene monomer (EPDM) rubber, acrylic rubber, nitrile-butadiene rubber (NBR), and silicone rubber. In addition, in order to further increase the heat dissipation filler content of the heat dissipation sheet, it may be desirable to use a matrix-forming component having a low density, for example, a density of 1 g/m³ or less. When a matrix-forming component having a high density is used, it may be difficult to increase the heat dissipation filler content of the sheet, and accordingly, it may be difficult to achieve sufficient heat dissipation properties.

In addition, the matrix-forming component may have a weight-average molecular weight within an appropriate range, which can significantly increase the heat dissipation filler content of the heat dissipation sheet. For example, the matrix-forming component may be a rubber-based component having a weight-average molecular weight of 650,000 to 1,250,000. When the weight-average molecular weight of the matrix-forming component is excessively large, it may be difficult to increase the heat dissipation filler content. On the other hand, when the weight-average molecular weight is excessively small, it is advantageous in significantly increasing the heat dissipation filler content but may be disadvantageous in terms of thermal conductivity.

Meanwhile, one surface of a heating element to which the heat dissipation sheet is applied may have irregularities, and when the heat dissipation sheet has low flexibility, the adhesion to the uneven surface may not be good, and when pressure is applied to increase the adhesion and thus the sheet is brought into close contact with the surface, the heat dissipation sheet may be cracked or damaged, which may significantly degrade heat dissipation properties. In addition, in the case of some matrix-forming components such as polyurethane, although flexibility properties may be good, there is a risk that shrinkage occurs after sheet formation or pores form in the manufactured sheet.

Accordingly, in one embodiment of the present invention, a rubber-based matrix-forming component may be used as the matrix-forming component to improve flexibility and prevent the above-described shrinkage and pore formation problems. The rubber-based matrix-forming component may be, for example, one or more selected from the group consisting of IR, BR, SBR, EPDM rubber, acrylic rubber, NBR, and silicone rubber. For example, the rubber-based matrix-forming component may be SBR, which, compared to other rubber-based components, has excellent solubility in solvents, low production costs, increased selection of crosslinking agents, low density, and excellent interfacial properties with a heat dissipation filler to be described below, and forms sheets with excellent quality.

Next, the crosslinking agent will be described. The crosslinking agent is used together with the matrix-forming component to supplement the mechanical strength of the sheet and increase density. In particular, since the matrix-forming component, especially, the rubber-based matrix-forming component, has a certain level of elasticity and restoring ability, it is not easy to include a large amount of heat dissipation filler in a sheet and make the sheet thin at the same time. That is, although the density of a heat dissipation sheet can be increased by performing a process of compressing the heat dissipation sheet, in the case of a sheet formed using a rubber-based matrix-forming component, it is not easy to increase the density of the heat dissipation sheet because, even when the sheet is compressed to have a predetermined desired thickness, after a certain period of time, a thickness before compression is restored due to elasticity and restoring ability. Therefore, the crosslinking agent is used in addition to the matrix-forming component, and through this, the density after compression can be maintained even after the elapse of time, and mechanical strength can be improved due to an increase in adhesion between the matrix-forming components. In addition, a distance between the heat dissipation fillers in the thickness direction of the heat dissipation sheet may be reduced, or contact between the heat dissipation fillers may occur, which may be more advantageous in improving the thermal conductivity in the vertical direction.

The crosslinking agent may be used without limitation as long as it is a known crosslinking agent suitable for crosslinking the selected matrix-forming component. When the matrix-forming component is a rubber-based matrix-forming component, the crosslinking agent may be one or more selected from the group consisting of a polyolefin-based crosslinking agent, an isocyanate-based crosslinking agent, and a peroxide-based crosslinking agent.

Specific types of the polyolefin-based, isocyanate-based, and peroxide-based crosslinking agents may be any known type, so the present invention is not particularly limited in this aspect. For example, the isocyanate-based crosslinking agent may be hexamethylene diisocyanate (HDMI). In addition, the peroxide-based crosslinking agent may be bis(tert-butylperoxy-2-isopropyl)benzene.

Meanwhile, the crosslinking agent is more preferably one or more selected from the group consisting of an isocyanate-based crosslinking agent and a peroxide-based crosslinking agent in terms of being advantageous in remarkably increasing the density of the heat dissipation sheet. Even more preferably, the crosslinking agent is a peroxide-based crosslinking agent. Furthermore, the peroxide crosslinking agent has the advantage of synergistically achieving the above-described effects of SBR and effects such as shortening curing time when SBR is used as a rubber-based component.

In addition, the crosslinking agent may be included in an amount of 0.5 to 10 parts by weight and more preferably 0.5 to 5 parts by weight based on 100 parts by weight of the matrix-forming component, and when the content of the crosslinking agent is less than 0.5 parts by weight, the sheet-forming ability, shape stability, and heat resistance of the heat dissipation sheet may be lowered, and it may be difficult to achieve a desired level of heat dissipation sheet density. In addition, when the content of the crosslinking agent exceeds 10 parts by weight, there is a possibility that hardness increases and flexibility decreases.

In addition, the heat dissipation filler is a component that imparts thermal conductivity to the heat dissipation sheet. The heat dissipation filler may be used without limitation as long as it is a heat dissipation filler known to have thermal conductivity, and may be, for example, a metal heat dissipation filler, a ceramic heat dissipation filler, or a carbon-based heat dissipation filler. The metal may be one of aluminum, magnesium, copper, nickel, silver, and gold, or a combination thereof, or an alloy thereof. The ceramic may be, for example, one or more selected from among alumina, silicon carbide, magnesium oxide, titanium dioxide, silicon dioxide, yttria, zirconia, aluminum nitride, silicon nitride, boron nitride, silica, zinc oxide, barium titanate, strontium titanate, beryllium oxide, single-crystal silicon, and manganese oxide. The carbon-based heat dissipation filler may be one or more selected from among graphite, graphene, carbon nanotubes, fullerene, carbon black, and the like. In addition, the heat dissipation filler may be a graphite composite that includes metal or ceramic nanoparticles on the graphite surface, or a graphite composite that additionally includes a polydopamine layer on the nanoparticles. Meanwhile, the heat dissipation filler may be appropriately selected in consideration of desired heat dissipation performance or additional insulation performance.

In addition, the heat dissipation filler may be spherical or plate-shaped particles, and may be plate-shaped in terms of improving thermal conductivity in the horizontal direction. Although the heat of a heating element may be generated by all components forming the heating element, there may be a hot spot where specific components generate a particularly large amount of heat, and in this case, thermal conduction in the horizontal direction has the advantage of dispersing heat concentrated in the hot spot to the periphery, thereby preventing heat from being concentrated.

In addition, the heat dissipation filler may have an average particle diameter of 1 to 200 μm. However, according to one embodiment of the present invention, the heat dissipation filler may have an average particle diameter of 50 μm or less, preferably 40 μm or less, and more preferably 20 to 40 μm, and for example, 20 to 33 μm, and the heat dissipation filler having such a particle diameter may be included in a high content of 90 wt % or more in the heat dissipation sheet. When the particle diameter of the heat dissipation filler is adjusted to an appropriate level, it is easy to include a high content of the heat dissipation filler in the heat dissipation sheet, the sheet-forming ability is improved, and surface quality can be improved because the phenomenon of the heat dissipation filler sticking to a surface after sheet formation is prevented. When the average particle diameter of the heat dissipation filler exceeds 40 μm, it is difficult to include a high content of the heat dissipation filler in a matrix implemented through the organic compound, and even when a sheet including a high content of the heat dissipation filler is manufactured, it is not very easy to form the sheet, and there is a possibility that the surface quality may be degraded. However, since the heat dissipation filler may have an average particle diameter of 1 μm or more and more preferably 20 μm or more, dispersibility and content in the matrix can be further increased, and accordingly, thermal conductivity can be further improved. Meanwhile, in the present invention, the particle diameter of the heat dissipation filler is a diameter when a shape is spherical, and in the case of a polyhedral filler or an amorphous filler, the particle diameter means the longest distance among the linear distances between two different points on the surface.

In addition, in order to include an increased content of the heat dissipation filler in the heat dissipation sheet, the heat dissipation filler may be designed to include a plurality of particle groups having different particle sizes. For example, the heat dissipation filler may include a first heat dissipation filler having a particle diameter of 1 to 5 μm, a second heat dissipation filler having a particle diameter of 10 to 20 μm, and a third heat dissipation filler having a particle size of 25 to 40 μm, which are included in a weight ratio of 1:1.5 to 3:3.5 to 5, and through this, the content of the heat dissipation filler in the heat dissipation sheet can be significantly increased. When the particle size distribution of the heat dissipation filler does not satisfy the above range, it may be difficult to include a high content of the heat dissipation filler in the heat dissipation sheet.

In addition, the heat dissipation filler is included in a dispersed form in a matrix implemented by crosslinking the matrix-forming component, and an interface formed between the matrix and the heat dissipation filler may have poor thermal conductivity properties due to low compatibility between the different materials, and accordingly, even though the thermal conductivity of the heat dissipation filler is excellent, the heat dissipation performance of the heat dissipation sheet may be low. In addition, low adhesion (or gap) may occur at the interface, in which case, the heat dissipation performance may be further reduced, and there is a possibility that the durability of the heat dissipation sheet is lowered, and cracks and the like may occur in the relevant area. Therefore, in order to improve properties at the interface between the heat dissipation filler and the matrix to be described below, the heat dissipation filler may be subjected to surface treatment or surface modification and used.

The surface treatment may refer to the removal of heterogeneous inorganic substances or impurities adhered to the surface of the heat dissipation filler, and the surface treatment may allow the thermal conductivity properties of the heat dissipation filler itself to be fully exhibited and may be advantageous in improving the properties of the interface between the matrix and the heat dissipation filler.

In addition, the surface modification may be used without limitation as long as it is a known modification capable of increasing compatibility between the heat dissipation filler and the matrix-forming component. For example, the surface modification may be a modification by which one or more functional groups selected from the group consisting of a hydroxyl group, an alkyl group, an alkane group, an amine group, and an aniline group are provided on the surface of the heat dissipation filler, wherein one or more selected among a hydroxyl group, an amine group, and an aniline group are preferably used, and an amine group and an aniline group are more preferably used.

The surface treatment or surface modification may be carried out by employing a known method, for example, acid treatment. The acid treatment may be performed by treating the heat dissipation filler with an acidic solution such as a nitric acid-based solution, a sulfuric acid-based solution, an aluminum-based solution, and a titanium-based solution and preferably a sulfuric acid-based solution or a nitric acid-based solution which are advantageous for achieving more improved thermal conductivity properties. Through the acid treatment, it is possible not only to remove inorganic substances or contaminants attached to the surface of the heat dissipation filler, but also to provide a hydroxyl functional group on the surface.

Figure 1:
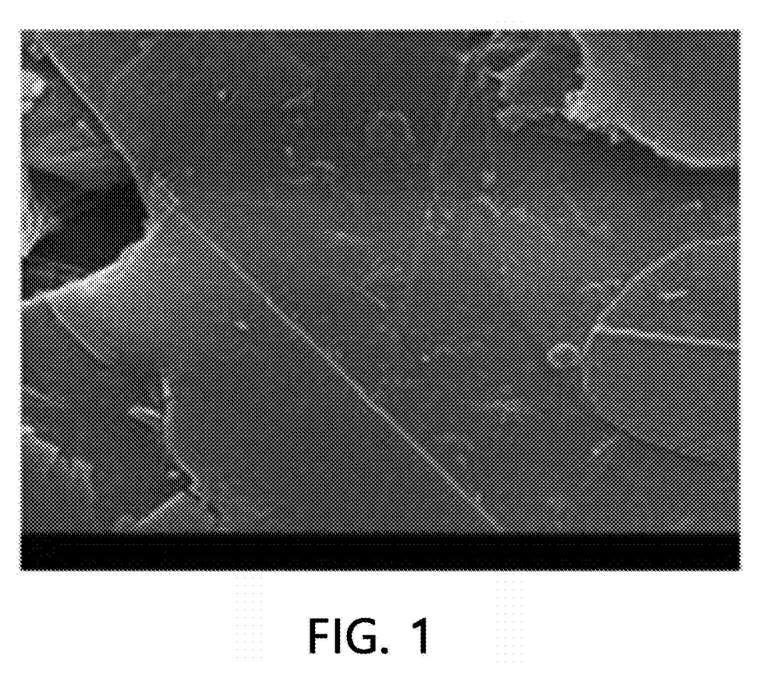
FIG. 1 is a scanning electron microscope (SEM) image of a surface of non-surface-modified boron nitride provided in a heat dissipation sheet according to one embodiment of the present invention.
Figure 2:
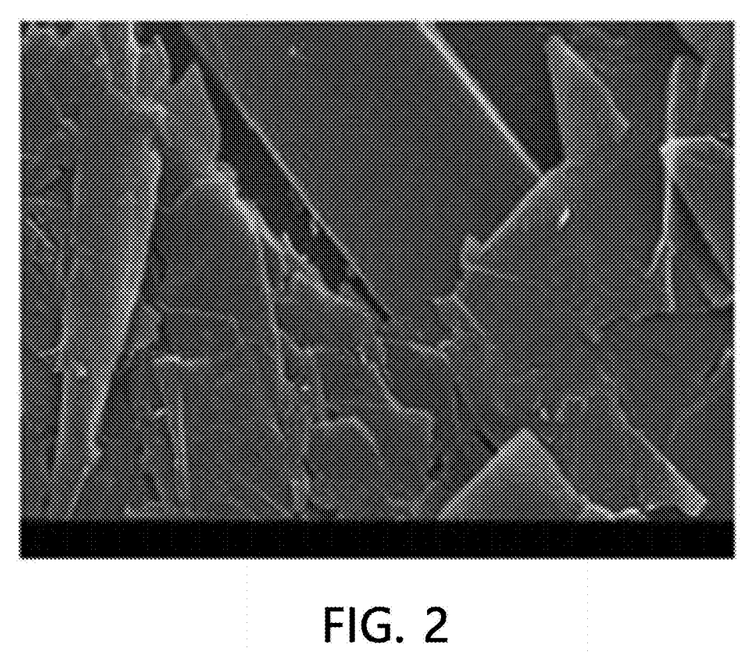
FIG. 2 is an SEM image of a surface of surface-modified boron nitride provided in a heat dissipation sheet according to one embodiment of the present invention.

Meanwhile, FIG. 1 is an SEM image of a surface of boron nitride, which is an example of a heat dissipation filler before acid treatment. As can be seen in FIG. 2, the surface of boron nitride may be more rough after acid treatment. Changes in surface morphology, including an increase in the surface roughness of the heat dissipation filler as described above, have the effect of structurally improving adhesion at an interface with a matrix, which is advantageous in achieving improved thermal conductivity properties, improved durability, and the like.

For example, a method of achieving the acid treatment may include the processes of adding 6 to 30 g of a heat dissipation filler per 100 g of an acidic solution and stirring at a temperature condition of 20 to 100° C. for 1 to 10 hours, and subsequently inputting the heat dissipation filler in water for neutralization and washing the same with distilled water. Here, in the step of stirring after adding the heat dissipation filler to the acidic solution, ultrasonic waves may be additionally applied during or after the stirring.

In addition, the above-described solvent may be a nonpolar solvent such as toluene, xylene, or methyl ethyl ketone. For example, the amount of the solvent may be 100 to 1,000 parts by weight based on 100 parts by weight of a binder resin, and the amount can be adjusted in consideration of an appropriate viscosity depending on the sheet-forming method.

The sheet composition may be stirred using a 3-roll mill and/or a PL mixer to uniformly disperse the heat dissipation filler and obtain an appropriate viscosity. The stirring process may be carried out using a high-power disperser such as 3-roll mill to improve the dispersibility of the heat dissipation filler and improve the thermal conductivity, density, and flexibility of the heat dissipation sheet.

In addition, a defoaming process for removing bubbles generated in the stirring process may be performed simultaneously with the stirring process or after the stirring process.

Thereafter, the homogeneously prepared sheet composition may have a viscosity of, for example, 1,500 to 3,500 cP, and in another example, 2,000 to 3,000 cP. In addition, the sheet-forming composition may be formed into a preliminary sheet by a conventional method, for example, by applying the composition onto a substrate in the form of a sheet. The application of the sheet composition on a substrate may be achieved using a known coating method, and, for example, knife coating using a comma coater may be used, but the present invention is not limited thereto.

In addition, the sheet composition applied in the form of a sheet on the substrate may be dried at a temperature of 70° C. to 130° C. In another example, the drying of the sheet composition may be initiated at an initial temperature of 70 to 85° C., and may be finished at a final temperature of 110 to 130° C. after increasing the drying temperature. In addition, since the drying time may vary depending on the drying temperature, the present invention is not particularly limited in this aspect. Meanwhile, the preliminary sheet may have a thickness of 80 to 150 µm after drying is completed, but the present invention is not limited thereto.

Subsequently, in step (2), a heat dissipation sheet is formed by crosslinking the matrix-forming component included in the preliminary sheet.

The crosslinking of the matrix-forming component in step (2) may be carried out in an appropriate manner depending on the type of matrix-forming component and the type of crosslinking agent. For example, the crosslinking reaction may be a thermal crosslinking reaction induced by heat treatment or a photocrosslinking reaction induced by light irradiation.

Step (2) according to one embodiment of the present invention may include crosslinking one or more preliminary sheets while applying heat and pressure, and cooling the crosslinked preliminary sheets.

During the crosslinking, a thermal crosslinking reaction may be induced while applying pressure, and through this, in addition to realizing the desired thickness, the density of the heat dissipation sheet can be increased and the amount of the heat dissipation filler included per unit volume can be further increased, and at the same time, the distance between the heat dissipation fillers can be shortened, and thus, heat dissipation properties can be further improved. In addition, when the heat dissipation filler has a plate-like shape, since orientation thereof is improved in the horizontal direction in the heat dissipation sheet and the vertical distance between the heat dissipation fillers is reduced, heat dissipation properties can be improved in both horizontal and vertical directions. In this case, a pressure of 2.5 to 5 kgf/mm² may be applied, and this may be advantageous in achieving the desired effect of the present invention.

In addition, the heat applied in the crosslinking may be 100 to 180° C., preferably 110 to 170° C., and more preferably 150 to 180° C., and the execution time may be 10 to 60 minutes and preferably 15 to 55 minutes.

Figure 3:
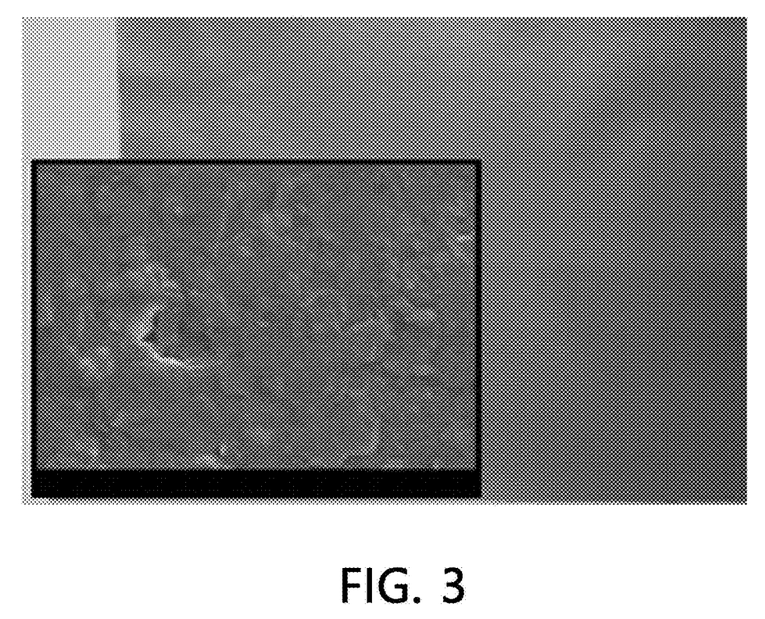
FIG. 3 is an SEM image of a surface of a heat dissipation sheet according to one embodiment of the present invention manufactured without performing cooling after crosslinking.
Figure 4:
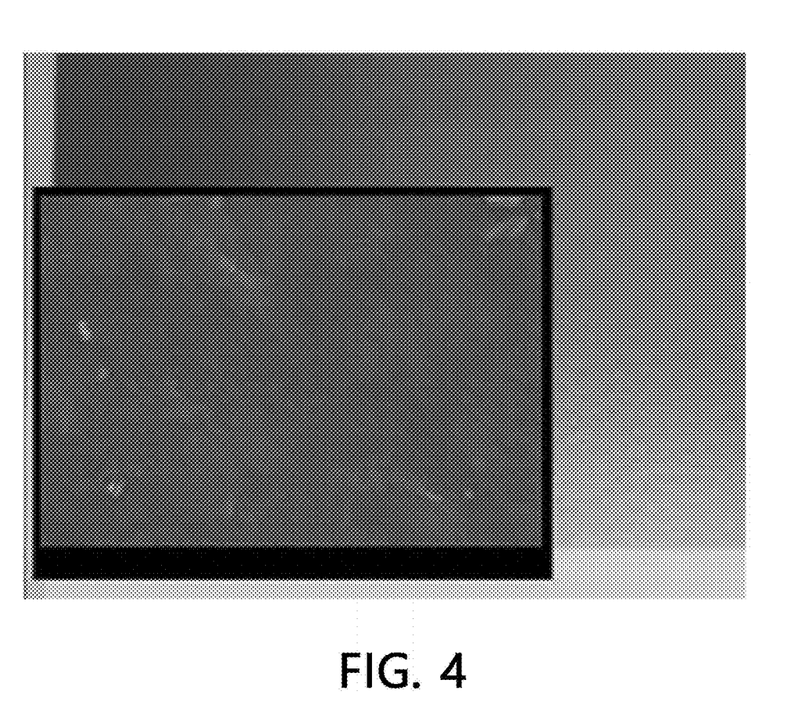
FIG. 4 is an SEM image of a surface of a heat dissipation sheet according to one embodiment of the present invention manufactured by additionally performing cooling after crosslinking.

In addition, the cooling is carried out to prevent the density reduction and thickness non-uniformity problems caused by matrix expansion occurring when the sheet is left at room temperature after thermal crosslinking, and has the advantage of implementing a heat dissipation sheet having a higher density and a uniform thickness. In addition, it is possible to implement a heat dissipation sheet with improved surface quality through the cooling. As shown in FIGS. 3 and 4, it can be seen that the heat dissipation sheet of FIG. 4, which was manufactured by performing cooling after thermal crosslinking, had better surface quality than the heat dissipation sheet of FIG. 3, which was manufactured without performing cooling after thermal crosslinking.

The cooling may be terminated when the formed heat dissipation sheet is cooled at a temperature of 60° C. or less, preferably 18 to 60° C., and more preferably 18 to 50° C. In addition, the cooling may be carried out for 10 to 60 minutes and preferably 15 to 55 minutes. In addition, a cooling rate may be, for example, 5 to 30° C./minutes. When the cooling temperature exceeds 60° C., there is a possibility of thickness change, and the heat dissipation sheet may stick to a surface of a cooling device, for example, a press, during the cooling process and may not be easily separated, and accordingly, the surface quality of the heat dissipation sheet may be significantly reduced and productivity may be lowered.

In addition, the cooling may also be carried out while applying pressure, and this has the advantage of minimizing the thickness change of the heat dissipation sheet. In this case, for example, a pressure of 2.5 to 5 kgf/mm² may be applied.

Meanwhile, the crosslinking and the cooling may be carried out while applying pressure using a first press and a second press having different temperatures. In this case, there are advantages that productivity is improved as compared to when carrying out the steps using one press while changing temperature conditions, and since the time between the crosslinking and the cooling is minimized or easily adjusted to a desired level, the quality of the heat dissipation sheet can be improved. The temperature and pressing time of the first press may be the temperature and execution time of the above-described crosslinking, and the temperature and pressing time of the second press may be the temperature and execution time of the above-described cooling.

Meanwhile, the crosslinking may be carried out by stacking two to five preliminary sheets and applying pressure thereto, and it may be more advantageous to crosslink a stack of multiple preliminary sheets while applying pressure than to crosslink a single preliminary sheet while applying pressure in achieving the desired level of heat dissipation thickness and density and improving productivity. When more than five preliminary sheets are stacked, the preliminary sheets may be pushed while being pressed, so the sheets may not be uniformly pressed, and the thickness may vary depending on a position in the heat dissipation sheet.

Meanwhile, when the thickness of an individual preliminary sheet is very thin (e.g., 40 µm or less), the process of stacking the preliminary sheets may not be easy. Therefore, in this case, it is preferable to carry out step (2) using one sheet rather than a stack of multiple sheets.

The thickness of a single heat dissipation sheet manufactured by carrying out step (2) may be, for example, 60 µm or less, and in another example, 30 to 60 µm.

Meanwhile, the preliminary sheet obtained in step (1) and the heat dissipation sheet obtained in step (2) may have a thickness reduction rate according to the following Mathematical Formula 1 of 20% or more, preferably 25% or more, and more preferably 40% or more, and in this case, a heat dissipation sheet can be designed to include a high content of heat dissipation filler inside and to have a high density, and it may be more advantageous in improving heat dissipation properties.

[Mathematical Formula 1]

$$\text{Thickness reduction rate (\%)} = \frac{\text{Preliminary sheet thickness } (\mu m) - \text{Heat dissipation sheet thickness } (\mu m)}{\text{Preliminary sheet thickness } (\mu m)} \times 100$$

In addition, a heat dissipation sheet obtained in step (2) may have a thickness change rate calculated according to the following Mathematical Formula 2 of 10% or less, preferably 5% or less, more preferably 2% or less, even more preferably 1% or less, and still more preferably 0.5% or less, even when using a rubber-based component as the matrix-forming component, after being allowed to stand at 40° C. for 50 hours, and in this case, there is an advantage that it is possible to minimize the degradation of heat dissipation properties occurring due to a decrease in quality or an increase in thickness due to deformation, in which the thickness of the implemented heat dissipation sheet changes or becomes non-uniform.

[Mathematical Formula 2]

$$\text{Thickness change rate (\%)} = \frac{\text{Heat dissipation sheet thickness after standing } (\mu m) - \text{Heat dissipation sheet thickness before standing } (\mu m)}{\text{Heat dissipation sheet thickness before standing } (\mu m)} \times 100$$

Meanwhile, in one embodiment of the present invention, the heat dissipation sheet implemented through the above-described manufacturing method may have a structure in which the heat dissipation filler is dispersed in the matrix formed by crosslinking the matrix-forming component.

In addition, in the heat dissipation sheet, the heat dissipation filler may be included at 85 wt % or more, preferably 90 wt % or more, and more preferably 95 wt % or less based on the total weight of the heat dissipation sheet, and the heat dissipation sheet may have a density of 1.6 g/m² or more, preferably 1.7 g/m² or more, and more preferably 1.8 g/m² or more. In this case, it may be advantageous in achieving excellent heat dissipation properties because the sheet may be implemented with a very thin thickness and include the heat dissipation filler dispersed at a high filling rate. On the other hand, when the heat dissipation filler is included at more than 95 wt % in the heat dissipation sheet, it is difficult to form the sheet, and there is a possibility that the sheet may be easily broken.

In addition, the heat dissipation sheet may have excellent heat dissipation properties and have a thermal conductivity of 25 W/mK or more, preferably 29 W/mK or more, and more preferably 33 W/mK or more.

In addition, the heat dissipation sheet may be implemented to have low permittivity and have a relative permittivity of 4 or less at a predetermined frequency, for example, 1 GHz, 5 GHz, 10 GHz, 15 GHz, 20 GHz, 25 GHz, 28 GHz, 30 GHz, or 35 GHz. The heat dissipation sheet having low permittivity, when used adjacent to a component transmitting or receiving a signal, has the advantage of preventing the disturbance or attenuation of the transmitted or received signal, which may occur due to a heat dissipation sheet.

MODES OF THE INVENTION

The present invention will be described in more detail through the following Examples. However, the following Examples are not intended to limit the scope of the present invention and should be construed as aiding understanding of the present invention.

Example 1

1 part by weight of bis(tert-butylphenoxy-2-isopropyl) benzene, which is a peroxide-based crosslinking agent, 900 parts by weight of graphite having a particle diameter of 90 µm as a heat dissipation filler, and toluene as a solvent were added to 100 parts by weight of SBR (200° C. melt flow rate (MFR): 5 g/min, weight-average molecular weight: 900,000) and stirred, and thus a sheet-forming composition having a viscosity of about 2,500 cP was obtained. The obtained sheet-forming composition was applied with a predetermined thickness on a substrate using a comma coater and then dried at 100° C. for five minutes, and thus a preliminary sheet having a thickness of about 100 µm was obtained. Subsequently, the preliminary sheet was pressed with a first press at 160° C. with a pressure of 3.1 kgf/mm², and thus a thermal crosslinking reaction was induced for 40 minutes. Subsequently, the resultant was cooled for 40 minutes while applying a pressure of 3.1 kgf/mm² using a second press at 50° C., and thus a heat dissipation sheet having a final single-sheet thickness of 60 µm and a heat dissipation filler content of 90 wt % was obtained.

Example 2

A sheet-forming composition was prepared using the same heat dissipation filler as in Example 1 but 3 parts by weight of DICY as a curing agent and 200 parts by weight of methyl ethyl ketone as a solvent were added to 100 parts by weight of a bisphenol A epoxy component (YG-011 manufactured by Kukdo Chemical Co., Ltd.) as a matrix-forming component, the prepared sheet-forming composition was applied with a predetermined thickness on a substrate using a comma coater, cured at 150° C. for 30 minutes, and then cooled in the same manner as in Example 1, and thus a heat dissipation sheet having a final thickness of 60 µm and a heat dissipation filler content of about 90 wt % was obtained.

Example 3

A heat dissipation sheet having a final thickness of 60 µm and a heat dissipation filler content of about 90 wt % was manufactured in the same manner as in Example 1 using the same heat dissipation filler as in Example 1, except that the type of matrix-forming component was changed to thermoplastic polyurethane (TPU).

Experimental Example 1

After manufacturing 100 heat dissipation sheets of each of Examples 1 to 3 of the same size, the number of specimens with cracks or ruptures and the number of specimens showing shrinkage or having pores on surfaces were counted and are expressed as a percentage with respect to the 100 specimens in the following Table 1.

TABLE 1

| | Example 1 | Example 2 | Example 3 |
|---|---|---|---|
| Matrix-forming component | Rubber-based component (SBR) | Epoxy component | Polyurethane component |
| Percentage of sheets with cracks/ruptures (%) | 0 | 80 | 0 |
| Percentage of sheets showing shrinkage or having pores (%) | 2 | 0 | 53 |

As can be seen from Table 1, the heat dissipation sheets of Example 1, which were prepared using a rubber-based component as a matrix-forming component, do not have cracks or ruptures, did not undergo shape change such as shrinkage, and has excellent surface quality.

Example 4

1 part by weight of bis(tert-butylphenoxy-2-isopropyl) benzene, which is a peroxide-based crosslinking agent, 1,329 parts by weight of plate-shaped boron nitride having a particle diameter of 32 μm as a heat dissipation filler, and toluene as a solvent were added to 100 parts by weight of SBR (200° C. MFR: 5 g/min, weight-average molecular weight: 900,000) and stirred, and thus a sheet-forming composition having a viscosity of about 2,500 cps was obtained. The obtained sheet-forming composition was applied with a predetermined thickness on a substrate using a comma coater and then dried at 100° C. for five minutes, and thus a preliminary sheet was obtained. Subsequently, three such preliminary sheets were stacked and then pressed with a first press at 160° C. with a pressure of 3.1 kgf/mm$^2$, and thus a thermal crosslinking reaction was induced for 40 minutes. Subsequently, the resultant was cooled for 40 minutes while applying a pressure of 3.1 kgf/mm$^2$ using a second press at 50° C., and thus a heat dissipation sheet having a thermal conductivity of 33.7 W/mK was obtained, as shown in Table 2 below.

Example 5

A heat dissipation sheet as shown in Table 2 below was manufactured in the same manner as in Example 1, except that a preliminary sheet was prepared by changing the type of crosslinking agent to hexamethylene diisocyanate, and then crosslinking and cooling processes were performed.

Comparative Example 1

A heat dissipation sheet as shown in Table 2 below was manufactured in the same manner as in Example 4 except that a crosslinking agent was not added.

Experimental Example 2

The following properties of the heat dissipation sheets of Examples 4 and 5 and Comparative Example 1 were evaluated, and the results are shown in Table 2. Specifically, dimensions, such as thickness, and weights of the heat dissipation sheets were measured immediately after manufacturing, and thickness reduction rates were calculated according to Mathematical Formula 1 below. In addition, after allowing the manufactured heat dissipation sheets to stand at 40° C. for 50 hours, thickness change rates were calculated according to the following Mathematical Formula 2.

[Mathematical Formula 1]

$$\text{Thickness reduction rate (\%)} = \frac{\text{Prelimiary sheet thickness (}\mu m\text{)} - \text{Heat dissipation sheet thickness (}\mu m\text{)}}{\text{Prelimiary sheet thickness (}\mu m\text{)}} \times 100$$

[Mathematical Formula 2]

$$\text{Thickness change rate (\%)} = \frac{\text{Heat dissipation sheet thickness after standing (}\mu m\text{)} - \text{Heat dissipation sheet thickness before standing (}\mu m\text{)}}{\text{Heat dissipation sheet thickness before standing (}\mu m\text{)}} \times 100$$

TABLE 2

|  | Example 4 | Example 5 | Comparative Example 1 |
|---|---|---|---|
| Matrix-forming component | SBR | SBR | SBR |
| Crosslinking agent type | Peroxide-based | Isocyanate-based | Not used |
| Preliminary sheet thickness (μm) | 140 | 142 | 140 |
| Heat dissipation sheet thickness immediately after manufacturing (μm) | 82.0 | 101.0 | 82.0 |
| Thickness reduction rate (%) | 41.4 | 28.9 | 41.4 |
| Density (g/m$^2$) | 1.81 | 1.71 | 1.81 |
| Heat dissipation sheet thickness after allowing to stand for 50 hrs (μm) | 82.2 | 109.3 | 138 |
| Thickness change rate (%) | 0.3 | 8.2 | 68.3 |

As can be seen from Table 2, in the case of Example 4 in which a peroxide-based crosslinking agent was used and Example 5 in which an isocyanate-based crosslinking agent was used, there is a thickness change of 10% or less after manufacturing, which is smaller than in the case of Comparative Example 1.

Examples 6 to 8

Heat dissipation sheets as shown in Table 3 below were manufactured in the same manner as in Example 4 except that a cooling temperature was changed as shown in Table 3 below.

Experimental Example 3

The thickness change rates of the heat dissipation sheets of Examples 4 and 6 to 8 were calculated in the same manner as in Experimental Example 2. In addition, while manufacturing a total of 1,000 heat dissipation sheets for each of the Examples, the number of heat dissipation sheets sticking to the second press was counted, and the results are shown in the following Table 3.

TABLE 3

|  | Example 4 | Example 6 | Example 7 | Example 8 |
|---|---|---|---|---|
| Matrix-forming component | SBR | SBR | SBR | SBR |
| Crosslinking agent type | Peroxide-based | Peroxide-based | Peroxide-based | Peroxide-based |

TABLE 3-continued

|  | Example 4 | Example 6 | Example 7 | Example 8 |
|---|---|---|---|---|
| Cooling temperature (° C.) | 50 | 60 | 65 | 70 |
| Preliminary sheet thickness (μm) | 140 | 140 | 140 | 140 |
| Heat dissipation sheet thickness immediately after manufacturing (μm) | 82.0 | 82.0 | 82.0 | 82.0 |
| Thickness reduction rate (%) | 41.4 | 41.4 | 41.4 | 41.4 |
| Heat dissipation sheet after allowing to stand for 50 hrs (μm) | 82.2 | 82.74 | 83.80 | 86.76 |
| Thickness change rate (%) | 0.3 | 0.9 | 2.2 | 5.8 |
| Number of heat dissipation sheets sticking to second press | 0 | 3 | 26 | 100 |

As can be seen from Table 3, when a cooling temperature is greater than 60° C., the number of heat dissipation sheets sticking to the second press increases, and a thickness change rate increases.

Example 9

A heat dissipation sheet was manufactured in the same manner as in Example 4 except that a cooling process was not performed.

Experimental Example 3

The SEM images of surfaces of the heat dissipation sheets of Examples 4 and 9 were taken, and the results are shown in FIG. 3 (Example 9) and FIG. 4 (Example 4).

As can be seen from FIGS. 3 and 4, the heat dissipation sheet of Example 9 shown in FIG. 3, which was manufactured without performing cooling, has a rough surface rather than a smooth surface, and the heat dissipation sheet of Example 4, which was manufactured by performing cooling, has excellent surface quality.

Examples 10 to 17

Heat dissipation sheets as shown in Table 4 below were manufactured in the same manner as in Example 4 except that the particle diameter of the heat dissipation filler and the content of the heat dissipation filler were changed as shown in Table 4 below.

Experimental Example 4

The following properties of the heat dissipation sheets of Examples 4 and 10 to 17 were evaluated, and the results are shown in Table 4 below.

1. Evaluation of Heat Dissipation Properties

Thermal conductivity was calculated from a thermal diffusivity measured by laser flash analysis (LFA), a specific heat measured by differential scanning calorimetry (DSC), and the density of the heat dissipation sheets.

In addition, after constructing a measuring instrument so that light-emitting diodes (LEDs) were provided at a predetermined interval along the circumference of a circle having a diameter of 25 mm, a thermometer was provided in the center of the circle, and a predetermined voltage was applied to the LEDs, the measuring instrument was placed inside an acrylic chamber having a dimension of 32 cm (width)×30 cm (length)×30 cm (height), and a temperature inside the acrylic chamber was adjusted to be 25±0.2° C. Subsequently, a heat dissipation sheet was placed on the LEDs of the measuring instrument, and predetermined input power was applied to the LEDs, and after a predetermined time had elapsed, the top of the heat dissipation sheet was thermally imaged, and a temperature was measured by the thermometer inside the measuring instrument. Subsequently, the average temperature of heat dissipation sheet parts corresponding to the positions of the LEDs according to the results of thermal imaging were measured and are expressed as "average temperatures," and temperatures measured by the thermometer inside the measuring instrument are expressed as "T.C." values.

In addition, as a standard for evaluating heat dissipation performance, the same input power was applied to the LEDs of the measuring instrument without a heat dissipation sheet, and after the same amount of time had elapsed, the top of the LEDs was thermally imaged, and a temperature was measured by the thermometer inside the measuring instrument and used as a default value. The average temperature measured by thermal imaging without a heat dissipation sheet was 53.8° C., and the T.C. was 66.3° C.

Meanwhile, in the case of Example 11, measurement was impossible because the specimen was severely cracked during the measurement.

2. Evaluation of Surface Quality

In order to evaluate the amount of heat dissipation filler discharged through a surface of a heat dissipation sheet, an adhesive sheet having the same size as the manufactured heat dissipation sheet was attached to one side of the heat dissipation sheet and then removed. The removed adhesive sheet was cut into 10 equal portions horizontally and vertically to obtain a total of 100 cells, and the number of cells to which the heat dissipation filler was attached was counted.

3. Evaluation of Flexibility

For each Example, a total of 1,000 heat dissipation sheets were bent with a curvature of 20 mm and then observed to determine whether cracks or ruptures had occurred, and the number of sheets with cracks or ruptures was counted.

TABLE 4

|  |  | Example 4 | Example 10 | Example 11 | Example 12 | Example 13 | Example 14 | Example 15 | Example 16 | Example 17 |
|---|---|---|---|---|---|---|---|---|---|---|
| Heat dissipation sheet thickness (μm) |  | 82 | 82 | 82 | 82 | 82 | 101 | 102 | 100 | 105 |
| Heat dissipation filler | Total content (wt %) | 93 | 95 | 97 | 93 | 93 | 90 | 90 | 90 | 90 |
|  | A (μm/wt %) | 32/93 | 32/95 | 32/97 | 40/93 | 45/93 | 32/60 | 32/67.5 | 32/72 | 32/51.4 |
|  | B (μm/wt %) | — | — | — | — | — | 16/30 | 16/22.5 | 16/18 | 16/25.7 |
|  | C (μm/wt %) | — | — | — | — | — | 4/0 | 4/0 | 4/0 | 4/12.6 |
|  | A:B:C weight ratio | — | — | — | — | — | 4:2:0 | 6:2:0 | 8:2:0 | 4.1:2.0:1 |

TABLE 4-continued

|  | Example 4 | Example 10 | Example 11 | Example 12 | Example 13 | Example 14 | Example 15 | Example 16 | Example 17 |
|---|---|---|---|---|---|---|---|---|---|
| T.C. (° C.) | 60.2 (−6.1) | 60.0 (−6.3) | Not measurable | 61.3 (−5.0) | 62.5 (−3.8) | 61.1 (−5.2) | 60.6 (−5.7) | 61.4 (−4.9) | 60.2 (−6.1) |
| Average temperature (° C.) | 45.7 (−8.1) | 45.6 (−8.2) | Not measurable | 46.5 (−7.3) | 49.0 (−4.8) | 46.5 (−7.3) | 45.9 (−7.9) | 41.7 (−6.7) | 45.3 (−8.5) |
| Thermal conductivity (W/mK) | 33.7 | 33.9 | Not measurable | 31.9 | 30.2 | 31.7 | 32.3 | 31.1 | 33.0 |
| Flexibility | 8 | 31 | 1,000 | 15 | 30 | 0 | 0 | 4 | 0 |
| Surface quality | 7 | 51 | 100 | 17 | 46 | 2 | 4 | 4 | 0 |

(Note:
In Table 4, "(−X)" in T.C. and average temperature indicates how much the T.C.'s and average temperatures of relevant Examples have decreased from default values.)

As can be seen from Table 4, when a large amount of heat dissipation filler is included as in the case of Example 11, the flexibility of a heat dissipation sheet is lowered. In addition, in the case of Example 13, which had a rather large average particle diameter, surface quality is not high, and accordingly, heat dissipation properties are degraded as compared to Example 4.

While exemplary embodiments of the present invention have been described above, the scope of the present invention is not limited to the embodiments presented herein, and those skilled in the art who understand the spirit of the present invention may easily suggest the other exemplary embodiments by adding, changing, deleting, or supplementing components within the same scope of the invention, and the other exemplary embodiments will also fall within the scope of the present invention.

The invention claimed is:

1. A method of manufacturing a heat dissipation sheet, comprising:
   (1) preparing a preliminary sheet including a matrix-forming component, a crosslinking agent, and a heat dissipation filler, wherein the heat dissipation filler includes a first heat dissipation filler having a particle diameter of 1 μm to 5 μm, a second heat dissipation filler having a particle diameter of 10 μm to 20 μm, and a third heat dissipation filler having a particle diameter of 25 μm to 40 μm, and wherein the second heat dissipation filler is included in a weight of 1.5 to 3 times a weight of the first heat dissipation filler, and wherein the third heat dissipation filler is included in a weight of 3.5 to 5 times the weight of the first heat dissipation filler; and
   (2) crosslinking the matrix-forming component included in the preliminary sheet to obtain the heat dissipation sheet.

2. The method of claim 1, wherein the matrix-forming component in the preliminary sheet is in an uncrosslinked state or in a partially crosslinked state.

3. The method of claim 1, wherein the step (2) includes:
   crosslinking of the preliminary sheet while applying heat and pressure to obtain a heated heat dissipation sheet; and
   cooling the heated heat dissipation sheet while applying pressure to obtain the heat dissipation sheet.

4. The method of claim 1, wherein step (2) further comprises stacking two to five of the preliminary sheets and applying heat and pressure thereto to obtain the heat dissipation sheet.

5. The method of claim 3, wherein the crosslinking is carried out using a first press and the cooling is carried out using a second press having a temperature different from that of the first press.

6. The method of claim 3, wherein the crosslinking is carried out at a temperature of 100° C. to 180° C. for 10 minutes to 60 minutes, and the cooling is carried out at a temperature of 18° C. to 60° C. for 10 minutes to 60 minutes.

7. The method of claim 1, wherein the heat dissipation filler is included in an amount of 85% by weight or more based on a total weight of the heat dissipation sheet.

8. The method of claim 1, wherein the heat dissipation filler is surface-modified with one or more functional groups selected from the group consisting of a hydroxyl group, an alkyl group, an amine group, and an aniline group.

9. The method of claim 1, wherein the matrix-forming component includes one or more rubber-based components selected from the group consisting of isoprene rubber (IR), butadiene rubber (BR), styrene-butadiene rubber (SBR), ethylene propylene diene monomer (EPDM) rubber, acrylic rubber, nitrile-butadiene rubber (NBR), and silicone rubber.

10. The method of claim 1, wherein the crosslinking agent includes one or more selected from the group consisting of an isocyanate-based crosslinking agent and a peroxide-based crosslinking agent.

11. The method of claim 1, wherein a thickness reduction rate calculated according to the following Mathematical Formula 1 is 20% or more:

[Mathematical Formula 1]

$$\text{Thickness reduction rate (\%)} = \frac{\text{Preliminary sheet thickness } (\mu m) - \text{Heat dissipation sheet thickness } (\mu m)}{\text{Preliminary sheet thickness } (\mu m)} \times 100.$$

12. The method of claim 1, wherein the matrix-forming component is a rubber-based component, and a thickness change rate calculated according to the following Mathematical Formula 2 after allowing the manufactured heat dissipation sheet to stand at 40° C. for 50 hours is less than 10%:

[Mathematical Formula 2]

$$\text{Thickness change rate (\%)} = \frac{\text{Heat dissipation sheet thickness after standing } (\mu m) - \text{Heat dissipation sheet thickness before standing } (\mu m)}{\text{Heat dissipation sheet thickness before standing } (\mu m)} \times 100.$$

13. The method of claim 1, wherein the matrix-forming component is styrene-butadiene rubber, and the crosslinking agent is a peroxide-based crosslinking agent.

* * * * *